US006509870B1

(12) United States Patent
Matsushita et al.

(10) Patent No.: US 6,509,870 B1
(45) Date of Patent: Jan. 21, 2003

(54) SOFTWARE-COMPENSATED CRYSTAL OSCILLATOR

(75) Inventors: Hiroshi Matsushita, San Francisco, CA (US); Paul W. McBurney, San Francisco, CA (US)

(73) Assignees: Seiko Epson Corporation, Tokyo (JP); eRide, Inc., San Francisco, CA (US)

( * ) Notice: Subject to any disclaimer, the term of this patent is extended or adjusted under 35 U.S.C. 154(b) by 0 days.

(21) Appl. No.: 10/079,248

(22) Filed: Feb. 19, 2002

(51) Int. Cl.[7] .............................. G01S 5/02; H04B 7/185
(52) U.S. Cl. ............................... 342/357.15; 342/357.12
(58) Field of Search ....................... 342/357.06, 357.12, 342/357.13, 357.15; 701/213, 215

(56) References Cited

U.S. PATENT DOCUMENTS 5,663,734 A * 9/1997 Krasner ....................... 342/357
5,874,914 A * 2/1999 Krasner ....................... 342/357
6,133,871 A * 10/2000 Krasner ................... 342/357.06

* cited by examiner

Primary Examiner—Dao Phan

(57) ABSTRACT

A navigation-satellite receiver comprises a crystal oscillator that is affected by local ambient temperature in a repeatable way. After locking onto a GPS satellite, the receiver is used to calculate the true frequency bias of the local crystal oscillator. GPS-system lock provides an atomic-clock basis for such measurements of true frequency. The current temperature of the crystal is measured and recorded in association with the true frequency bias measurement. The data is then used to generate a ninth-order polynomial that describes the frequency drift of the crystal over temperature. Then during receiver initialization when the local reference oscillator is not in lock, the ambient temperature is measured and used to index the ninth-order polynomial to estimate the actual crystal frequency. Such frequency estimate is then used as a basis to find signal from visible SV's in an overhead constellation.

6 Claims, 1 Drawing Sheet

SOFTWARE-COMPENSATED CRYSTAL OSCILLATOR

FIELD OF THE INVENTION

Figure 1:
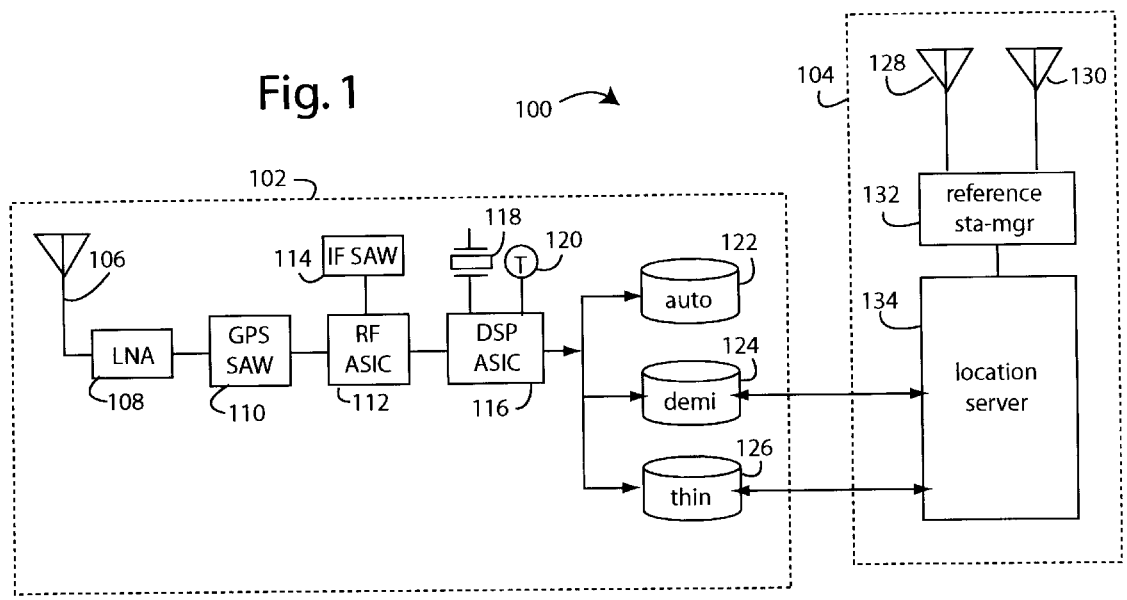

The present invention relates to navigation satellite receivers, and more particularly to methods and systems for accurately estimating the frequency of the local reference oscillator in a satellite navigation receiver during initialization.

DESCRIPTION OF THE PRIOR ART

The global positioning system (GPS) is a satellite-based radio-navigation system built and operated by the United States Department of Defense at a cost of over $13 billion. Twenty-four satellites circle the earth at an altitude of 20,200 km, and are spaced in orbit such that at any time a minimum constellation of six satellites is visible to any user. Each satellite transmits an accurate time and position signal referenced to an atomic clock. A typical GPS receiver locks on to this atomic clock, and then can very accurately measure the time delay for the signal to reach it, and the apparent receiver-satellite distance can then be calculated. Measurements from at least four satellites allow a GPS receiver to calculate its position, velocity, altitude, and time.

A GPS receiver that has just been turned-on does not yet know where it is, how much its crystal oscillator is in error, nor what time it is. All these are needed to find and lock onto the satellite transmissions, and so a search must be made of all the possibilities. The search has to be wider for large initial uncertainties in local time and reference clocks. The search effort can be reduced if the frequency and time can be tightly controlled or closely estimated.

The crystal oscillator in a GPS receiver that has not yet locked onto a satellite is basically free running. The typical phase locked loop circuit is not in lock. The actual operating frequency error can be quite large, and is highly dependent on temperature due to the nature of piezoelectric crystals. The temperature and other biases create a frequency uncertainty that increases the radio spectrum that must be searched during initialization. The time uncertainty further adds to the search problem during initialization because the satellite ID can be wrong or the expected Doppler shift can be wrong.

High-sensitivity GPS receivers create even more of a problem when the time or frequency uncertainty is large. Finding signal energy when that energy is extremely faint requires making smaller steps and dwelling at each step longer. So having a better initial estimate of the local reference oscillator can improve time-to-first-fix.

SUMMARY OF THE INVENTION

It is therefore an object of the present invention to provide a GPS receiver that can compensate its local crystal oscillator to reduce frequency uncertainties during initialization.

Briefly, a navigation-satellite receiver embodiment of the present invention comprises a crystal oscillator that is affected by local ambient temperature in a repeatable way. During lock on a GPS satellite, the receiver is used to calculate the true frequency bias of the local crystal oscillator. The current temperature of the crystal is measured and recorded in association with the true frequency bias measurement. The data is then used to generate a ninth-order polynomial that describes the frequency drift of the crystal over temperature. Then during receiver initialization when the local reference oscillator is not in lock, the ambient temperature is measured and used to index the ninth-order polynomial to estimate the actual crystal frequency. Such frequency estimate is then used as a basis to find signal from visible SV's in an overhead constellation.

An advantage of the present invention is that a system and method are provided for faster initialization of navigation satellite receivers.

Another advantage of the present invention is that a system and method are provided for improving the sensitivity navigation satellite receivers.

These and other objects and advantages of the present invention will no doubt become obvious to those of ordinary skill in the art after having read the following detailed description of the preferred embodiments which are illustrated in the various drawing figures.

IN THE DRAWINGS

Figure 2:
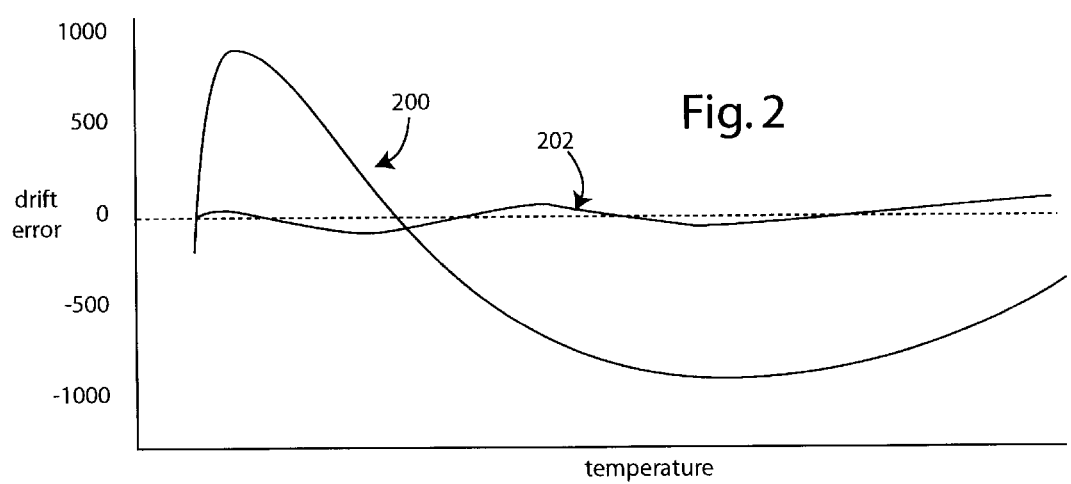

FIG. 1 is a functional block diagram of a navigation platform embodiment of the present invention; and FIG. 2 is a graph representing the temperature versus drift-error of the crystal oscillator embodiment of the present invention in FIG. 1.

DETAILED DESCRIPTION OF THE PREFERRED EMBODIMENT

FIG. 1 illustrates a GPS receiver network 100, in an embodiment of the present invention, that includes a navigation platform 102 supported by a network server 104.

Each GPS measurement platform 102 preferably comprises a GPS antenna 106, a low-noise amplifier (LNA) 108, a GPS surface acoustic wave (SAW) filter 110, a radio frequency (RF) application specific integrated circuit (ASIC) 112 with an intermediate frequency (IF) SAW-filter 114, a digital signal processor (DSP) 116, a reference crystal 118, and a reference-crystal temperature sensor 120.

In general, there are three types of GPS measurement platform embodiments of the present invention that are categorized by how independent of the server they can operate. An autonomous client 122 can function and provide navigation solutions to a user with only minimal help from the server 104, e.g., differential correction data. A demi-client 124 needs more help, e.g., polynomial models that simplify ephemeris and time bias calculations. A thin-client 126 lays off just about all the navigation calculations on the server 104, and basically provides only observational measurements from its point of view of the SV constellation. The navigation solutions are returned for local display if a user is there and wants to see them.

In a thin-client especially, the DSP is a shared part with some other non-GPS application. As such, multi-threaded application programs are not needed at the client and only simple program loops are executed.

The server 104 typically comprises a number of reference station antennas 128 and 130 that provide GPS signal inputs to a reference station manager 132. A location server 134 can provide support information to the demi-client 124 for improved time-to-first-fix and position solution quality.

High-sensitivity receivers require a great deal of digital data processing and CPU time. It can occur that ordinary signal levels can be processed by a local processor, but high-sensitivity calculations would overload the local processor. In such case, the observational measurements are forwarded to a more capable navigation processor that can specialize in such work and constantly re-use its executable code.

The local reference oscillator crystal 118 will have a frequency drift error that will vary as a function of temperature. In FIG. 2, a curve 200 represents such an uncompensated function. The curve 200 is preferably approximated with a ninth-order polynomial equation, and the coefficients of which as computed and stored during manufacturing calibration. A curve 202 represents what is typically possible when such ninth-order polynomial equation is used to compensate the temperature drift in software for initialization.

The reference-crystal temperature sensor 120 is used to measure the temperature of the local reference oscillator crystal 118. The first use is to collect data to build curve 200 during manufacturing calibration when the navigation platform 102 is initialized and tracking SV's. The subsequent use is to provide and index value so the ninth-order polynomial equation can be computed from stored coefficients while the navigation platform 102 is initializing and trying to lock onto its first SV.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A navigation satellite receiver, comprising:
   a navigation platform able to track and lock onto GPS satellites;
   a local reference frequency crystal oscillator that drifts with temperature and that affects the frequency uncertainty of signal lock before initialization;
   a temperature sensor for measuring a current temperature of the local reference frequency crystal oscillator;
   a set of stored values representing coefficients to a polynomial that fits a self-measured frequency drift error versus temperature; and
   a processor for using the set of stored values to compute a corrected local reference frequency crystal oscillator frequency given a measurement obtained by the temperature sensor.

2. The navigation satellite receiver of claim 1, wherein:
   the navigation platform can receive aid for initialization from a network server.

3. The navigation satellite receiver of claim 1, wherein:
   the local reference frequency crystal oscillator drives a digital signal processor that searches for GPS signals in time and frequency during an initialization and subsequently computes a navigation solution.

4. The navigation satellite receiver of claim 1, wherein:
   the local reference frequency crystal oscillator can be software compensated for frequency drift by a digital signal processor during searches for GPS signals in time and frequency during an initialization.

5. A method for software-compensation of a local reference frequency crystal oscillator, the method comprising the steps of:
   tracking a constellation of GPS satellites to provide a time and frequency basis with a navigation platform;
   measuring ambient temperature of said navigation platform;
   recording the drift errors for local reference frequency crystal oscillator at a variety of measured temperatures;
   building a polynomial equation to best fit data obtained in the steps of measuring and recording; and
   storing a set of coefficient values for said polynomial equation;
   wherein, a frequency drift of said local reference frequency crystal oscillator can be software-compensated using said set of coefficient values.

6. The method of claim 5, further comprising the steps of:
   attempting to initialize said navigation platform by searching for GPS satellite signals in frequency and time domains;
   measuring ambient temperature of said navigation platform;
   indexing said set of coefficient values to compute a drift error at a current temperature; and
   software-correcting a local reference frequency crystal oscillator according to said polynomial equation and a measured crrent temperature.

* * * * *